United States Patent [19]
Yamamoto et al.

[11] Patent Number: 5,373,262
[45] Date of Patent: Dec. 13, 1994

[54] VOLTAGE CONTROLLED OSCILLATOR INCLUDING A DIELECTRIC RESONATOR PROVIDED WITH A C-SHAPED ELECTRODE AND METHOD OF REGULATING OSCILLATION FREQUENCY THEREOF

[75] Inventors: Hiroyuki Yamamoto; Atsushi Inoue; Tatsuo Bizen, all of Kyoto, Japan

[73] Assignee: Murata Manufacturing Co., Ltd., Kyoto, Japan

[21] Appl. No.: 9,854

[22] Filed: Jan. 27, 1993

[30] Foreign Application Priority Data

Jan. 27, 1992 [JP] Japan ................................ 4-037101

[51] Int. Cl.$^5$ ........................ H03B 5/18; H01P 7/10
[52] U.S. Cl. ........................ 331/96; 331/67; 331/177 V; 333/219.1
[58] Field of Search ......... 331/67, 96, 117 D, 108 D, 331/107 DP, 177 V; 333/219, 204, 219.1

[56] References Cited

U.S. PATENT DOCUMENTS

| | | | |
|---|---|---|---|
| 4,574,255 | 3/1986 | Fujii et al. | 331/66 X |
| 4,758,922 | 7/1988 | Ishigaki et al. | 331/219 X |
| 5,105,176 | 4/1992 | Okamura et al. | 333/219 |
| 5,227,739 | 7/1993 | Manda et al. | 331/96 |
| 5,300,903 | 4/1994 | Okamura et al. | 333/219 |

FOREIGN PATENT DOCUMENTS 0506476  9/1992  European Pat. Off.

*Primary Examiner*—David Mis
*Attorney, Agent, or Firm*—Ostrolenk, Faber, Gerb & Soffen

[57] ABSTRACT

In a voltage controlled oscillator, a dielectric resonator is mounted on a circuit board and a metal case is mounted on the circuit board to shield the dielectric resonator. The dielectric resonator comprises a C-shaped first electrode which is provided in a dielectric body, second and third electrodes which are arranged on upper and lower sides of the first electrode, a signal connecting pattern which is extended from the first electrode toward a side surface of the dielectric body, and earth connecting patterns which are extended from the first, second and third electrodes toward the side surface of the dielectric body, to provide predetermined impedance between the earth connecting pattern and the signal connecting pattern. The dielectric resonator is arranged with the second and third electrodes in parallel with a major surface of the circuit board, and the second electrode is upwardly exposed. A portion of the second electrode portion at a predetermined position is adapted to be trimmed so as to regulate the resonance frequency of the dielectric resonator, so as to regulate the oscillator frequency of the voltage controlled oscillator. The dielectric resonator can be miniaturized with no reduction of its Q-value.

23 Claims, 3 Drawing Sheets

VOLTAGE CONTROLLED OSCILLATOR INCLUDING A DIELECTRIC RESONATOR PROVIDED WITH A C-SHAPED ELECTRODE AND METHOD OF REGULATING OSCILLATION FREQUENCY THEREOF

BACKGROUND OF THE INVENTION

1. Field of the Invention

The present invention relates to a voltage controlled oscillator, and more particularly, it relates to a voltage controlled oscillator comprising a triplate type dielectric resonator and a method of regulating its oscillation frequency.

2. Description of the Background Art

A voltage controlled oscillator forms a circuit shown in FIG. 4, for example. The voltage controlled oscillator shown in FIG. 4 includes an oscillating part 1 and a buffer part 2. In the oscillating part 1, which includes an amplifier circuit 3 and a feedback circuit 4, an output from the amplifier circuit 3 partially feeds back by means of the feedback circuit 4, to cause oscillation. The oscillation frequency of this voltage controlled oscillator is determined by the circuit constant of the feedback circuit 4.

In a field other than the voltage controlled oscillator, a feedback circuit is generally formed by inductive reactance and capacitive reactance. In the voltage controlled oscillator, however, the feedback circuit 4 employs a dielectric coaxial resonator 5 which can attain a high Q-value (which is an index of the selectivity of the resonance frequency) in place of the inductive reactance and the capacitive reactance. A variable-capacitance diode 6 is coupled in parallel with the resonator 5 to adjust the capacitive reactance, thereby allowing variation of the oscillation frequency.

Referring to FIG. 5, an exemplary mechanical structure of a conventional voltage controlled oscillator is now described. This voltage controlled oscillator includes a circuit board 7. The circuit board 7 includes an insulating substrate of ceramic, for example, while an interconnection pattern (not shown) is formed on an upper major surface of the insulating substrate and an earth pattern is formed substantially entirely over a lower major surface thereof.

The dielectric coaxial resonator 5 described above with reference to FIG. 4 is arranged on the upper major surface of the circuit board 7, to be connected to the aforementioned interconnection pattern. The dielectric coaxial resonator 5 comprises a dielectric body 8. This dielectric body 8 is provided with a through hole 9 having a circular section and extending along its axial direction. The dielectric body 8 is in the form of a square pole whose section perpendicular to the axial direction is square-shaped. Each edge of the square forming the section of the dielectric body 8 is selected to have a length of 6 mm, for example. An inner peripheral conductor 10 is applied onto an inner peripheral surface of the dielectric body 8 defining the through hole 9, while an outer peripheral conductor 11 is applied onto an outer peripheral surface of the dielectric body 8. Further, a short-circuit conductor (not shown) is applied onto a left end surface of the dielectric body 8 in FIG. 5 for short-circuiting the inner peripheral conductor 10 and the outer peripheral conductor 11. A right end surface of the dielectric body 8 in FIG. 5 is in an open state with no application of a conductor. A lead 12 is arranged on the side of this open end surface so that its first and second ends are connected to the inner peripheral conductor 10 and the interconnection pattern formed on the circuit board 7 respectively.

This dielectric coaxial resonator 5 has a relation of $L=\lambda g/4$, where L represents its axial length and $\lambda g$ represents the wavelength in its coaxial line. The resonance frequency of the dielectric coaxial resonator 5 is found by this equation.

Discrete electronic components 13a, 13b, 13c, ... such as a transistor, a capacitor, and a variable-capacitance diode are arranged on the upper major surface of the circuit board 7 to be connected to the interconnection pattern. A metal case 14 is mounted on the circuit board 7, to cover the dielectric coaxial resonator 5 and the electronic components 13a, 13b, 13c, ... The circuit board 7 is placed on a flat base 15, so that the earth pattern provided on the lower major surface of the circuit board 7 is connected to this base 15. The base 15 is provided with downwardly extending earth terminals 16a and 16b. On the other hand, the circuit board 7 is provided with a plurality of downwardly extending terminals 17a, 17b, 17c, 17d, ..., which pass through the base 15 while being electrically insulated from this base 15, to extend in parallel with the earth terminals 16a and 16b. Some of the terminals 17a, 17b, 17c, 17d, ... are adapted to be input and/or output signals, while the other ones are adapted to supply a voltage.

The oscillation frequency of this voltage controlled oscillator is regulated in the following manner: The dielectric coaxial resonator 5 can be regarded as forming a parallel resonance circuit of capacitive reactance formed between the inner and outer peripheral conductors 10 and 11 and inductive reactance formed along the longitudinal direction of the inner and outer peripheral conductors 10 and 11. Therefore, it is possible to increase the resonance frequency of this parallel resonance circuit by partially trimming the outer peripheral conductor 11 from its open end surface toward the short-circuit conductor. On the other hand, it is possible to reduce the resonance frequency by partially trimming the short-circuit conductor. Thus, the resonance frequency of the dielectric coaxial resonator 5 can be varied to regulate the oscillation frequency of the voltage controlled oscillator.

As hereinabove described, the dielectric coaxial resonator 5 has relatively wide end surfaces with each edge measuring 6 mm, for example. Therefore, the height of the dielectric coaxial resonator 5 hinders the voltage controlled oscillator from being reduced in height. In order to enable reduction in height of the voltage controlled oscillator, the dielectric coaxial resonator may be reduced in height to 1.5 mm, for example. However, such miniaturization of the dielectric coaxial resonator leads to reduction in the Q-value.

Further, the dielectric coaxial resonator 5 having an open end surface is easily influenced by the metal case 14, which degrades its electric characteristics such as the frequency. Particularly in a half-wave dielectric coaxial resonator (not shown) which resonates on the basis of the relation $L=\lambda g/2$, such electric characteristics are remarkably influenced by the metal case since both end surfaces of the resonator are in open states.

In recent years, the discrete electronic components 13a, 13b, 13c, ... have been increased in packaging density on the circuit board 7. In this case, it may be difficult to trim the outer conductor 11 or the short-circuit conductor in order to regulate the resonance frequency of the dielectric coaxial resonator 5.

SUMMARY OF THE INVENTION

Accordingly, an object of the present invention is to provide a voltage controlled oscillator comprising a dielectric resonator which can be miniaturized with no reduction in Q-value and is hardly influenced by a metal case.

Another object of the present invention is to provide a method of regulating an oscillation frequency of a voltage controlled oscillator, which can easily regulate the oscillation frequency of the voltage controlled oscillator, by trimming a prescribed portion of a dielectric resonator even if components are packaged with high density.

The present invention is directed to a voltage controlled oscillator comprising a circuit board, a dielectric resonator which is mounted on one major surface of the circuit board and a metal case which is mounted on the circuit board to shield the dielectric resonator, and various features of the present invention resides in the structure and arrangement of the dielectric resonator.

According to an illustrative embodiment of the present invention, the dielectric resonator comprises a dielectric body. The dielectric body is provided therein with a C-shaped first electrode. A planar second electrode is arranged on an upper side of the first electrode, to be opposite to the first electrode through a part of the dielectric body. A planar third electrode is arranged on a lower side of the first electrode, to be opposite to the first electrode through another part of the dielectric body. A signal extracting pattern is drawn out from the first electrode to reach a side surface of the dielectric body, while respective first, second and third earth extracting patterns are drawn out from the first, second and third electrodes to reach the side surface of the dielectric body. The dielectric body is provided on its side surface with a signal terminal which is connected with the signal extracting pattern, and an earth terminal which is connected with the first, second and third earth terminals in common. The signal extracting pattern and the first, second and third earth extracting patterns are spaced apart at an interval for providing prescribed impedance. This type of dielectric resonator is disclosed in detail in U.S. patent applications Ser. Nos. 832,357 (filed on Feb. 6, 1992), 832,786 (filed on Feb. 7, 1992) and 832,793 (filed on Feb. 7, 1992) in the name of the assignee.

The aforementioned dielectric resonator is so arranged that the second and third electrodes extend in parallel with the major surface of the circuit board.

According to the voltage controlled oscillator comprising the aforementioned dielectric resonator, the dielectric resonator can be reduced in height, whereby the voltage controlled oscillator can be miniaturized. In this dielectric resonator, the combination of the first and second electrodes as well as the combination of the first and third electrodes have stripline structures respectively and the first electrode has a C shape, whereby the Q-value is not reduced even if the dielectric resonator is reduced in height, unlike the conventional dielectric coaxial resonator. Further, the dielectric resonator has a triplate structure wherein the first electrode is arranged between the second and third electrodes, whereby the dielectric resonator is hardly influenced by the metal case and the electric characteristics of the voltage controlled oscillator can be stabilized.

The dielectric resonator provided in the aforementioned voltage controlled oscillator preferably has at least one of the second and third electrodes exposed on the surface of the dielectric body. Therefore, it is possible to easily regulate the oscillation frequency of the voltage controlled oscillator by partially trimming at least the exposed one of the second and third electrodes. If the second electrode is to be partially trimmed, for example, the second electrode is preferably formed on the upper surface of the dielectric body.

According to a method of regulating the oscillation frequency of the aforementioned voltage controlled oscillator, at least one of the second and third electrodes extending in parallel with the major surface of the circuit board is partially trimmed, whereby the oscillation frequency can be regulated with no interference with the components packaged on the circuit board even if the components have high packaging density. As hereinabove described, the dielectric resonator having a triplate structure is hardly influenced by the metal case, whereby the resonance frequency, regulated in this way remains unchanged even if the metal case is arranged to cover the dielectric resonator after regulation of the resonance frequency. Thus, it is not necessary to regulate the resonance frequency of the dielectric resonator in consideration of the influence caused by the metal case, whereby the regulating operation can be simplified.

The foregoing and other objects, features, aspects and advantages of the present invention will become more apparent from the following detailed description of embodiments of the present invention when taken in conjunction with the accompanying drawings.

DESCRIPTION OF THE PREFERRED EMBODIMENTS

Figure 1:
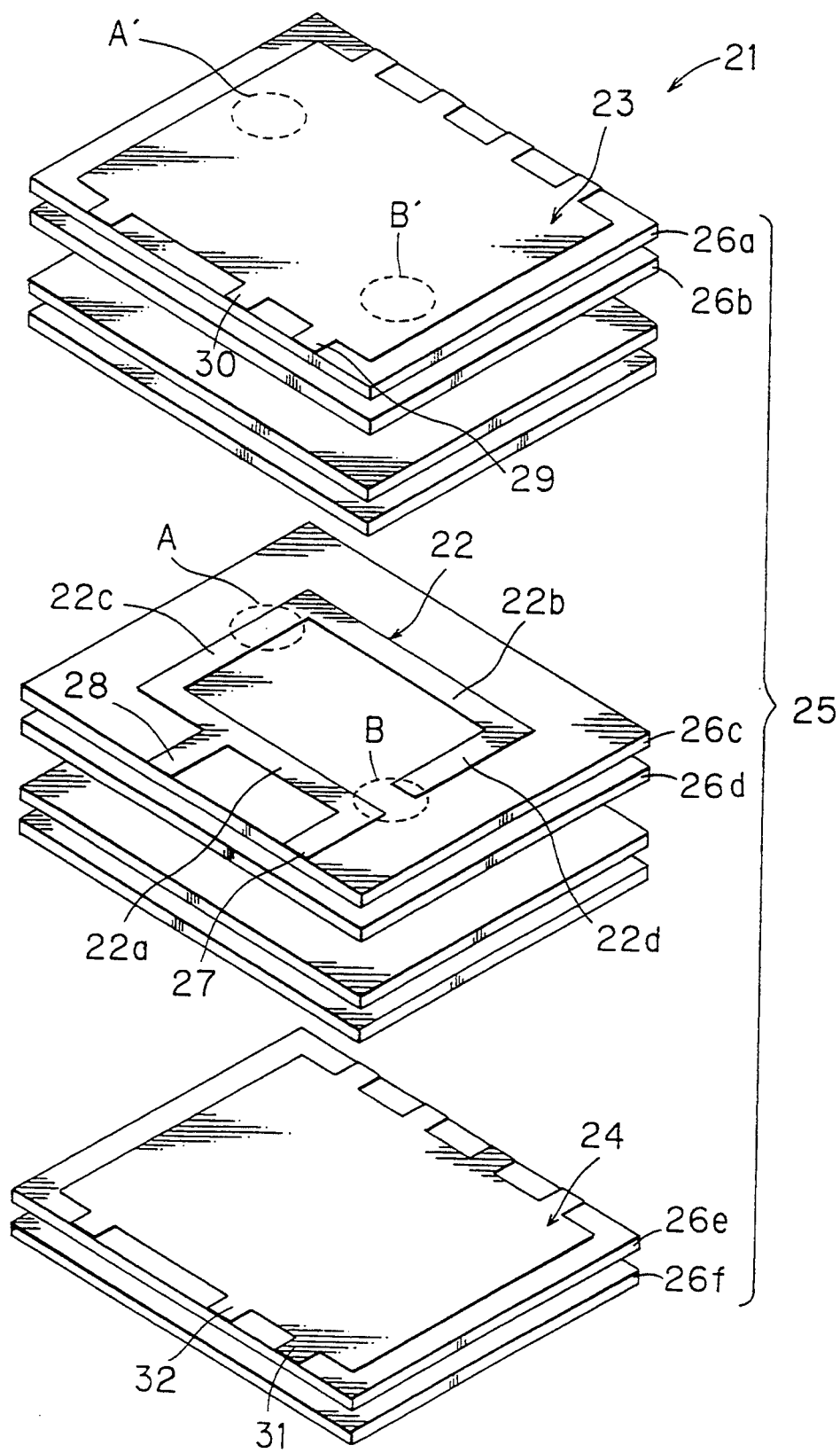
FIG. 1 is an exploded perspective view for illustrating the structure of a dielectric resonator included in a voltage controlled oscillator according to an embodiment of the present invention.
Figure 2:
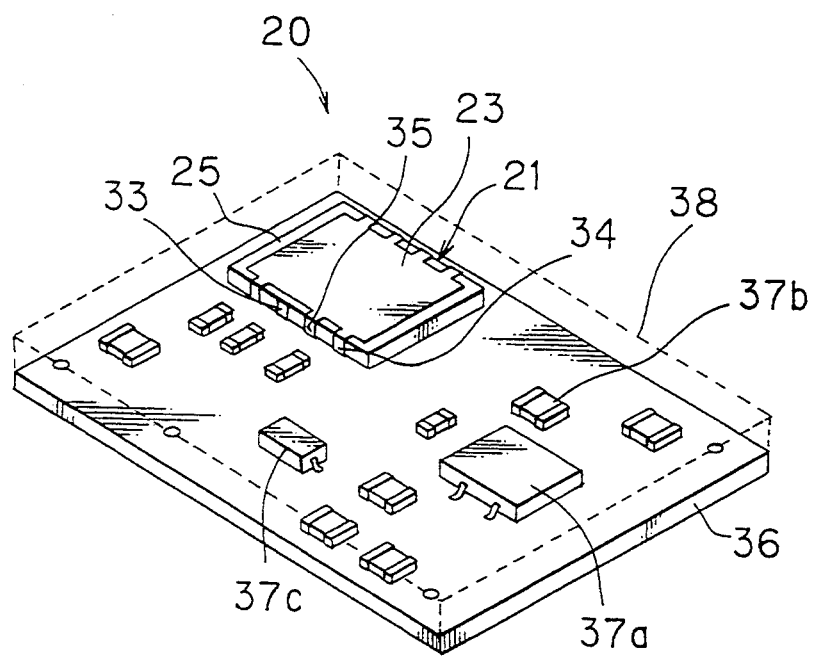
FIG. 2 is a perspective view showing a voltage controlled oscillator comprising the dielectric resonator shown in FIG. 1.

As shown in FIG. 2, a voltage controlled oscillator 20 comprises a dielectric resonator 21. This dielectric resonator 21 has a triplate structure formed by a C-shaped first electrode 22 and planar second and third electrodes 23 and 24 which are arranged on upper and lower sides of the first electrode 22, as shown in FIG. 1.

The dielectric resonator 21 comprises a dielectric body 25. As shown in FIG. 1, the dielectric body 25 is obtained by stacking a plurality of dielectric green sheets $26a$, $26b$, . . . , $26c$, $26d$, . . . , $26e$ and $26f$ and integrally firing the same. As understood from FIG. 1, the dielectric green sheets $26a$ and $26b$, . . . are located between the first and second electrodes 22 and 23, while the dielectric green sheets $26c$ and $26d$, . . . are located between the first and third electrodes 22 and 24. The first and second electrodes 23 and 24 are opposite to the first electrode 22 respectively.

The first electrode 22 defines a coil electrode, which is formed by a combination of linearly extending pattern members 22a, 22b, 22c and 22d. The pattern members 22a and 22b are opposite to each other, while the pattern member 22c connects first ends of the pattern members 22a and 22b with each other. The pattern member 22d is arranged on a second end of the pattern member 22b, to be opposite to the pattern member 22c. The pattern member 22d is not connected to the pattern member 22a. Thus, the first electrode 22 forms an inductance (coil) component by the pattern members 22a to 22d, while forming a capacitance component by a gap portion between the pattern members 22a and 22d. The pattern member 22a is connected with a first earth extracting pattern 27 and a signal extracting pattern 28 which are drawn out to reach a side surface of the dielectric body 25.

The second and third electrodes 23 and 24 form earth electrodes respectively. The second electrode 23 is formed on an upper surface of the dielectric body 25, to be exposed on the surface of this dielectric body 25. The third electrode 24 is arranged in the interior of the dielectric body 25. The second electrode 23 is connected with a second earth extracting pattern 29 and other earth extracting patterns 30, ... which are drawn out to reach the side surface of the dielectric body 25. The third electrode 24 is also connected with a third earth extracting pattern 31 and other earth extracting patterns 32, ... which are drawn out to reach the side surface of the dielectric body 25.

The aforementioned first, second and third earth extracting patterns 27, 29 and 31 are vertically aligned with each other on the side surface of the dielectric body 25, while the remaining earth extracting patterns 30, ... and 32, ... are also aligned with each other in a similar manner. The signal extracting pattern 28 and the first, second and third earth extracting patterns 27, 29 and 31 are spaced apart at an interval for providing prescribed impedance. As shown in FIG. 2, the dielectric body 25 is provided on its side surface with a signal terminal 33 which is connected with the signal extracting pattern 28, an earth terminal 34 which is connected with the first, second and third earth extracting patterns 27, 29 and 31 in common, and earth terminals 35, ... which are connected with the respective ones of the earth extracting patterns 30, ... and 32, ... in common.

The height of such a dielectric resonator 21 can be reduced to not more than 1.5 mm, for example.

Referring to FIG. 2, the dielectric resonator 21 is packaged on an upper major surface of a circuit board 36. This circuit board 36 comprises an insulating substrate of ceramic, for example, an interconnection pattern (not shown) which is formed on an upper major surface of the insulating substrate and an earth pattern which is formed substantially entirely over a lower major surface thereof. The dielectric resonator 21 is so arranged that the second and third electrodes 23 and 24 are in parallel with the upper major surface of the circuit board 36, and the signal terminal 33 and the earth terminals 34, 35, ... are electrically connected to the interconnection pattern respectively.

Discrete electronic components 37a, 37b, 37c, ... such as a transistor, a capacitor and a variable-capacitance diode are arranged on the upper major surface of the circuit board 36, to be connected to the interconnection pattern.

A metal case 38 is mounted on the circuit board 36 to shield the dielectric resonator 21, as shown by broken lines in FIG. 2. The metal case 38 shields not only the dielectric resonator 21 but the overall upper major surface of the circuit board 36.

Figure 5:
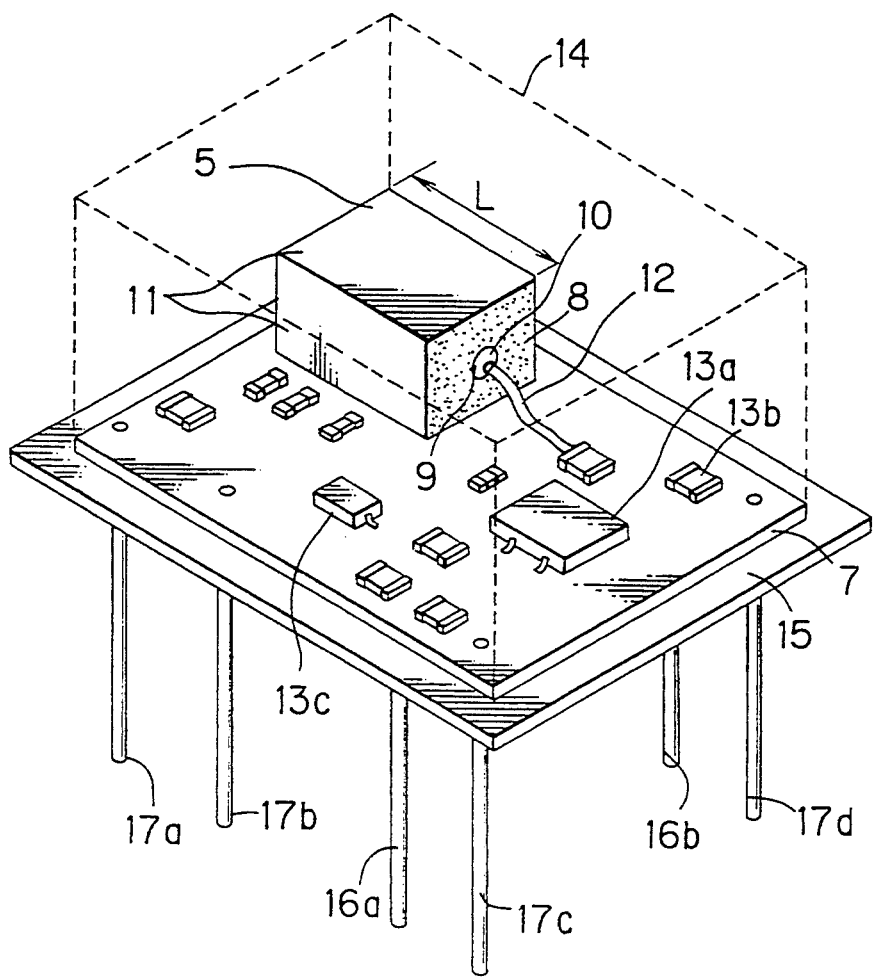
FIG. 5 is a perspective view showing a conventional voltage controlled oscillator.

Elements corresponding to the base 15 and the terminals 16a, 16b, 17a, 17b, 17c, 17d, ... shown in FIG. 5 are also applied to the voltage controlled oscillator 20 shown in FIG. 2. Alternatively, the base 15 and the terminals 16a, ... shown in FIG. 5 may be omitted and electrodes for serving as terminals may be provided on the side surface and/or the lower major surface of the circuit board 36, so that the voltage controlled oscillator 20 is surface-mountable.

As hereinafter described, it is possible to regulate the oscillation frequency of the voltage controlled oscillator 20 by trimming a prescribed position of the second electrode 23 which is located on the upper surface of the dielectric resonator 21.

As shown in FIG. 1, the pattern members 22a to 22d included in the first electrode 22 of the dielectric resonator 21 provide an inductance component. It is possible to increase an apparent inductance component by trimming a portion A' of the second electrode 23 corresponding to a portion A of the first electrode 22 or a portion close thereto, for example, thereby reducing the resonance frequency of the dielectric resonator 21. On the other hand, another portion B of the first electrode 22 provides a capacitance component. It is possible to reduce an apparent capacitance component by trimming a portion B' of the second electrode 23 corresponding to this portion B or a portion close to the same, thereby increasing the resonance frequency of the dielectric resonator 21. The oscillation frequency of the voltage controlled oscillator 20 can be regulated by regulating the resonance frequency of the dielectric resonator 21 in the aforementioned manner.

The trimmed portion of the second electrode 23 is not restricted to being the aforementioned portion A' or B', but any portion may be trimmed so far as this portion exerts an influence on the inductance or capacitance component of the first electrode 22.

According to this embodiment, the dielectric resonator 21 is arranged with the exposed second electrode 23 directed upward. Alternatively, the dielectric resonator 21 may be arranged with the second electrode 23 directed toward the circuit board 36. In this case, the circuit board 36 may be previously provided with a through hole in a position corresponding to the dielectric resonator 21, so that the second electrode 23 can be trimmed from below the circuit board 36 via the through hole. Or, the circuit board 36 may be provided with a through hole capable of receiving the dielectric resonator 21, so that the dielectric resonator 21 is arranged in this through hole.

Although the second electrode 23 is exposed in the aforementioned embodiment, the third electrode 24 may be exposed in place of the second electrode 23, or both of the second and third electrodes 23 and 24 may be exposed.

Figure 3:
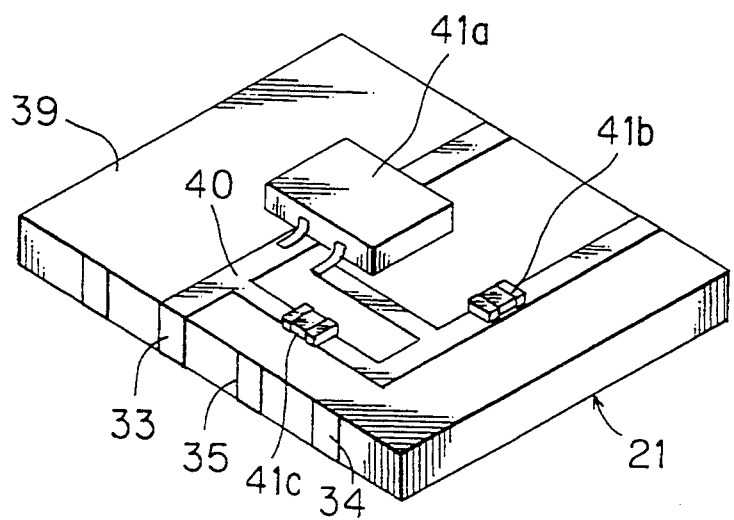
FIG. 3 is a perspective view showing a principal part of a voltage controlled oscillator according to another embodiment of the present invention.
Figure 4:
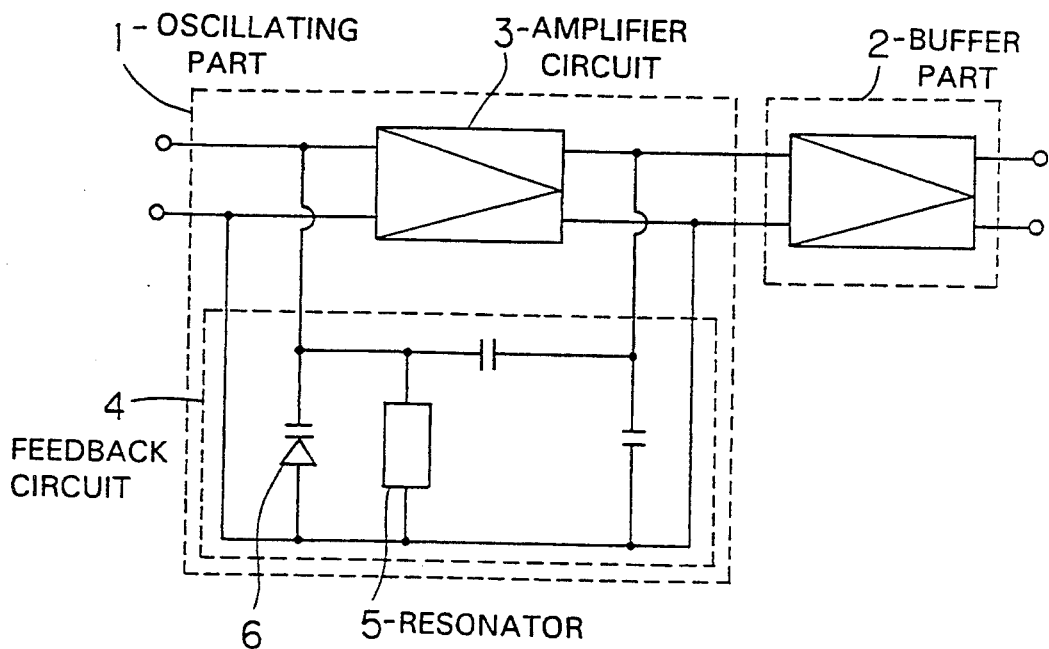
FIG. 4 is a block diagram showing a circuit provided by a conventional voltage controlled oscillator.

With reference to FIG. 3, another embodiment of the present invention is now described. An electric insulating layer 39 is formed to cover an upper surface of a dielectric resonator 21. The electric insulating layer 39 is provided thereon with some interconnection patterns including an interconnection pattern 40 which is connected to a signal terminal 33. Some discrete electronic components 41a, 41b, 41c, ... are arranged on the dielectric resonator 21 to be connected with the interconnection patterns 40, . . . These electronic components 41a, 41b, 41c, . . . correspond to parts of the electronic components 13a, 13b, 13c, . . . shown in FIG. 2.

While various modifications are available in relation to the modes of arrangement of the dielectric resonator 21 and the electronic components as hereinabove described, the height of the dielectric resonator 21 can be reduced to not more than 1.5 mm when the structure shown in FIG. 2 is employed as described above, whereby the thickness of the voltage controlled oscillator 20 including the metal case 38 and the circuit board 37 can be reduced to about 3 mm, for example.

The structure of the dielectric resonator which is employed in the voltage controlled oscillator according to the present invention is not restricted to that shown in each of the aforementioned embodiments. For example, the shape of the first electrode may be arbitrarily modified so far as this electrode has a C shape forming inductance and capacitance components.

Although the present invention has been described and illustrated in detail, it is clearly understood that the same is by way of illustration and example only and is not to be taken by way of limitation, the scope of the present invention being limited only by the terms of the appended claims.

What is claimed is:

1. A voltage controlled oscillator comprising:
   a circuit board having a major surface;
   a dielectric resonator on said major surface of said circuit board; and
   a metal case mounted on said circuit board so as to shield said dielectric resonator,
   said dielectric resonator comprising:
   a dielectric body having an upper surface, a lower surface and a side surface,
   a C-shaped first electrode provided in the interior of said dielectric body having a first portion which forms an inductance and a second portion which forms a capacitance,
   wherein said first portion of said C-shaped first electrode comprises a conductor having two opposite ends, and said second portion of said C-shaped first electrode comprises a gap defined between said two opposite ends,
   a planar second electrode arranged opposite an upper side of said first electrode and opposed to said first electrode through a part of said dielectric body,
   a planar third electrode arranged opposite a lower side of said first electrode and opposed to said first electrode through another part of said dielectric body,
   a signal extracting pattern extending from said first electrode to said side surface of said dielectric body, and
   first, second and third earth extracting patterns extending from said first, second and third electrodes, respectively, to reach said side surface of said dielectric body.

2. A voltage controlled oscillator in accordance with claim 1, wherein at least one of said second and third electrodes is exposed at an upper or lower surface of said dielectric body.

3. A voltage controlled oscillator in accordance with claim 2, wherein said second electrode is formed on said upper surface of said dielectric body.

4. A voltage controlled oscillator in accordance with claim 1, wherein said dielectric body comprises a stacked and cofired plurality of dielectric green sheets.

5. A voltage controlled oscillator in accordance with claim 1, further comprising an electric insulating layer covering said upper surface of said dielectric body, an interconnection pattern being formed on said insulating layer, and an electronic component being arranged on said insulating layer in a state electrically connected with said interconnection pattern.

6. A method of regulating an oscillation frequency of a voltage controlled oscillator in accordance with claim 2, comprising the step of partially trimming at least one of said second and third electrodes which is exposed at said upper or lower surface of said dielectric body.

7. A method of regulating an oscillation frequency of a voltage controlled oscillator in accordance with claim 3, comprising the step of partially trimming said second electrode.

8. A voltage control oscillator in accordance with claim 1, wherein said signal extracting pattern and first, second and third earth extracting patterns are spaced apart in a direction parallel to said first, second and third electrodes, with a selected interval therebetween, so as to provide a predetermined impedance therebetween.

9. A voltage control oscillator in accordance with claim 8, wherein the dielectric body has on its side surface a signal terminal which is connected with said signal extracting pattern, and an earth terminal which is connected commonly with the first, second and third earth extracting patterns.

10. A voltage control oscillator in accordance with claim 1, wherein at least one of said second and third electrodes is exposed at an upper or lower surface of said dielectric body.

11. A method of regulating an oscillation frequency of a voltage controlled oscillator in accordance with claim 10, comprising the step of partially trimming said at least one of said second and third electrodes being exposed on said upper or lower surface of said dielectric body.

12. A voltage control oscillator in accordance with claim 1, wherein said second electrode is exposed at said upper surface of said dielectric body.

13. A method of regulating an oscillation frequency of a voltage controlled oscillator in accordance with claim 12, comprising the step of partially trimming said second electrode.

14. A voltage controlled oscillator in accordance with claim 1, wherein said side surface includes a plurality of faces of said dielectric resonator, said dielectric resonator having the shape of a polyhedron defined by said faces and by said upper and lower surfaces, and said faces extending between said upper and lower surfaces;
   wherein first, second and third earth extracting patterns extend from said first, second and third electrodes, and said signal extracting pattern extends from said first electrode, to same face of said dielectric body.

15. A voltage control oscillator in accordance with claim 2, wherein both of said second and third electrodes are exposed at said upper and lower surfaces of said dielectric body, respectively.

16. A method of regulating an oscillation frequency of a voltage controlled oscillator in accordance with claim 15, comprising the step of partially trimming both of said second and third electrodes which are exposed at said upper and lower surfaces of said dielectric body, respectively.

17. A voltage control oscillator in accordance with claim 10, wherein both of said second and third electrodes are exposed at said upper and lower surfaces of said dielectric body, respectively.

18. A method of regulating an oscillation frequency of a voltage controlled oscillator in accordance with claim 17, comprising the step of partially trimming both of said second and third electrodes which are exposed at said upper and lower surfaces of said dielectric body, respectively.

19. A voltage control oscillator in accordance with claim 1, wherein said dielectric resonator is arranged so that said second and third electrodes extend parallel to said major surface of said circuit board.

20. A voltage control oscillator in accordance with claim 1, wherein said conductor of said C-shaped electrode comprises a plurality of strip-shaped pattern members conductively connected to one another and said gap is defined between a first one and a last one of said strip-shaped pattern members.

21. A method as in claim 7, wherein a portion of said second electrode is trimmed opposite said first portion of said first electrode so as to increase said inductance characteristic and thereby decrease a resonant frequency of said dielectric resonator.

22. A method as in claim 21, wherein a portion of said second electrode is trimmed opposite said second portion of said first electrode so as to decrease said capacitance characteristic and thereby increase a resonant frequency of said dielectric resonator.

23. A method as in claim 7, wherein a portion of said second electrode is trimmed opposite said second portion of said first electrode so as to decrease said capacitance characteristic and thereby increase a resonant frequency of said dielectric resonator.

* * * * *